(12) United States Patent
Tanaka et al.

(10) Patent No.: US 9,673,313 B2
(45) Date of Patent: Jun. 6, 2017

(54) SILICON CARBIDE SEMICONDUCTOR DEVICE AND FABRICATION METHOD THEREOF

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Atsushi Tanaka, Tsukuba (JP); Noriyuki Iwamuro, Tsukuba (JP); Shinsuke Harada, Tsukuba (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/403,422

(22) PCT Filed: Mar. 18, 2013

(86) PCT No.: PCT/JP2013/057746
§ 371 (c)(1),
(2) Date: Nov. 24, 2014

(87) PCT Pub. No.: WO2013/175840
PCT Pub. Date: Nov. 28, 2013

(65) Prior Publication Data
US 2015/0102363 A1    Apr. 16, 2015

(30) Foreign Application Priority Data

May 25, 2012    (JP) ................................. 2012-120263

(51) Int. Cl.
*H01L 21/28*    (2006.01)
*H01L 21/336*    (2006.01)
(Continued)

(52) U.S. Cl.
CPC ........ *H01L 29/7802* (2013.01); *H01L 21/046* (2013.01); *H01L 29/045* (2013.01);
(Continued)

(58) Field of Classification Search
CPC .......... H01L 29/66068; H01L 29/1608; H01L 29/7827; H01L 29/7397; H01L 29/66666;
(Continued)

(56) References Cited

U.S. PATENT DOCUMENTS

2006/0057796 A1* 3/2006 Harada et al. ................. 438/199
2009/0096020 A1* 4/2009 Yamanobe .......... H01L 29/0619
257/337

(Continued)

FOREIGN PATENT DOCUMENTS

JP    4-239137 A    8/1992
JP    8-102495 A    4/1996
(Continued)

OTHER PUBLICATIONS

Deboy et al., "A new generation of high voltage MOSFETs breaks the limit line of silicon", IEEE IEDM, 1998, pp. 683-685.
(Continued)

*Primary Examiner* — Kimberly Rizkallah
*Assistant Examiner* — Brian Turner
(74) *Attorney, Agent, or Firm* — Westerman, Hattori, Daniels & Adrian, LLP

(57) ABSTRACT

A silicon carbide semiconductor device has a first-conductivity-type semiconductor layer having a lower impurity concentration and formed on a first-conductivity-type semiconductor substrate, a second-conductivity-type semiconductor layer having a higher impurity concentration and selectively formed in the first-conductivity-type semiconductor layer, a second-conductivity-type base layer having a lower impurity concentration formed on a surface of the
(Continued)

second-conductivity-type semiconductor layer, a first-conductivity-type source region selectively formed in a surface layer of the base layer, a first-conductivity-type well region formed to penetrate the base layer from a surface to the first-conductivity-type semiconductor layer, and a gate electrode formed via a gate insulation film on a surface of the base layer interposed between the source region and the well region. Portions of the respective second-conductivity-type semiconductor layers of different cells can be connected to each other by a connecting portion in a region under the well region.

5 Claims, 13 Drawing Sheets

(51) Int. Cl.
*H01L 29/12* (2006.01)
*H01L 29/24* (2006.01)
*H01L 29/739* (2006.01)
*H01L 29/78* (2006.01)
*H01L 29/66* (2006.01)
*H01L 29/06* (2006.01)
*H01L 21/04* (2006.01)
*H01L 29/423* (2006.01)
*H01L 29/04* (2006.01)
*H01L 29/10* (2006.01)
*H01L 29/16* (2006.01)

(52) U.S. Cl.
CPC ...... *H01L 29/0696* (2013.01); *H01L 29/1095* (2013.01); *H01L 29/4238* (2013.01); *H01L 29/66068* (2013.01); *H01L 29/66325* (2013.01); *H01L 29/66712* (2013.01); *H01L 29/7395* (2013.01); *H01L 29/0634* (2013.01); *H01L 29/1608* (2013.01)

(58) Field of Classification Search
CPC ... H01L 29/78; H01L 29/7802; H01L 21/046; H01L 21/0475; H01L 29/04; H01L 29/0619; H01L 29/0653; H01L 29/1095; H01L 29/01
USPC ............ 257/66, 77, 330, 339, 288, E29.084; 438/105, 268, 270
See application file for complete search history.

(56) References Cited

U.S. PATENT DOCUMENTS

2010/0187640 A1  7/2010  Miyata
2013/0313576 A1* 11/2013  Nakano ............... H01L 29/8611
                                                257/77

FOREIGN PATENT DOCUMENTS

| JP | 2009-99714 A | 5/2009 |
| JP | 2009-105177 A | 5/2009 |
| JP | 2010-87126 A | 4/2010 |
| JP | 2010-177454 A | 8/2010 |
| JP | 2011-258635 A | 12/2011 |
| WO | 2004/036655 A1 | 4/2004 |

OTHER PUBLICATIONS

Fujihira, " Theory of Semiconductor Superjunction Devices", Jpn. J. Appl. Phys., vol. 36, Part 1, No. 10, Oct. 1997, pp. 6254-6262.
Shenai et al., "Optimum Semiconductors for High-Power Electronics", IEEE Transactions on Electron Devices, vol. 36, No. 9, Sep. 1989, pp. 1811-1823.
International Search Report dated Jun. 11, 2013 issued in corresponding application No. PCT/JP2013/057746.
Notification of Transmittal of Translation of the International Preliminary Report on Patentability (Form PCT/IB/326) of International Application No. PCT/JP2013/057746 mailed Dec. 4, 2014 with Forms PCT/IB/373, PCT/IB/338 and PCT/ISA/237 (with English Translation).

* cited by examiner

FIG. 3

| | PRESENT INVENTION | | | | | CONVENTIONAL TECHNOLOGIES | |
|---|---|---|---|---|---|---|---|
| | FIRST EMBODIMENT | SECOND EMBODIMENT | THIRD EMBODIMENT | FOURTH EMBODIMENT | FIFTH EMBODIMENT | CONVENTIONAL SiCMOSFET | Si-IGBT |
| ELEMENT BREAKDOWN VOLTAGE (RT) | 1450V | 1452V | 1453V | 1455V | 1455V | 880V | 1448V |
| ON-RESISTANCE (RT) | 2.80mΩcm² | 4.21mΩcm² | 2.99mΩcm² | 2.85mΩcm² | 4.33mΩcm² | 2.80mΩcm² | 11.2mΩcm² |
| TURN-OFF LOSS (150°C) | 0.85mJ | 0.86mJ | 0.85mJ | 0.89mJ | 0.90mJ | 0.89mJ | 2.10mJ |
| TURN-ON LOSS (150°C) | 0.90mJ | 0.98mJ | 0.92mJ | 0.90mJ | 0.92mJ | 0.98mJ | 3.10mJ |
| GATE THRESHOLD VALUE (175°C) | 3.2V | 3.2V | 3.3V | 3.2V | 3.3V | 3.2V | 3.9V |
| TURN-OFF CAPABILITY (175°C) | >100A | >100A | >100A | >100A | >100A | >100A | >100A |
| LOAD SHORT CIRCUIT CAPABILITY (175°C) | >15μs | >15μs | >15μs | >15μs | >15μs | 3.8μs | 4.8μs |

▨ SOURCE REGION

▤ BASE REGION

▧ SECOND-CONDUCTIVITY-
TYPE REGION (P-LAYER)
FOR GATE OXIDE FILM
PROTECTION

FIG.8A
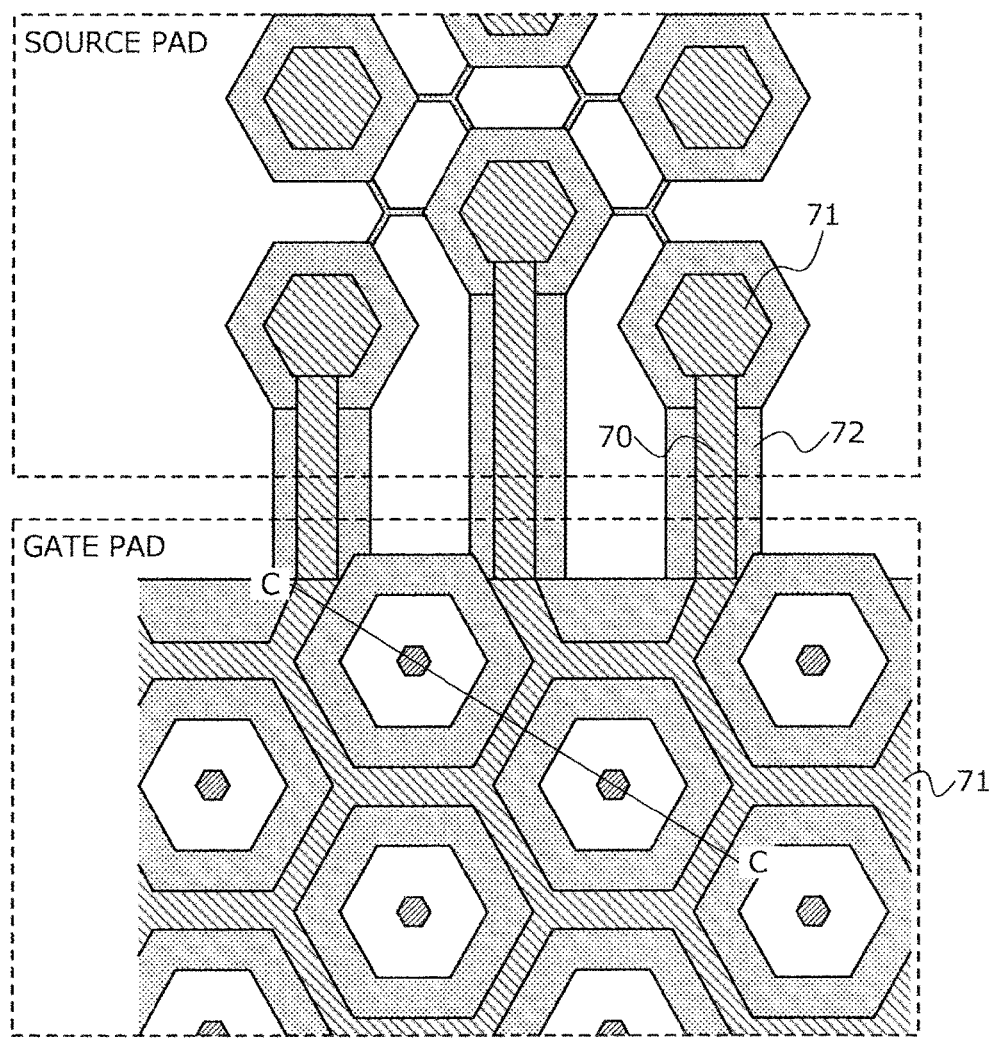
FIG.8B
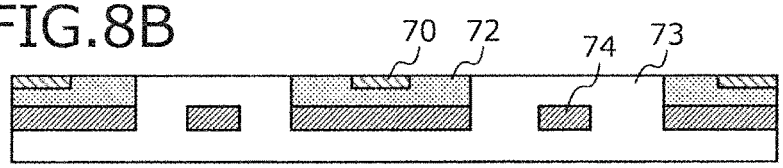
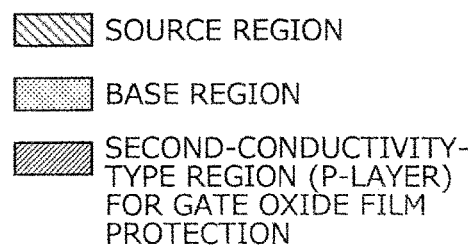
SOURCE REGION
BASE REGION
SECOND-CONDUCTIVITY-TYPE REGION (P-LAYER) FOR GATE OXIDE FILM PROTECTION R.T  Time: 100ns/div 200°C  Time: 100ns/div

SILICON CARBIDE SEMICONDUCTOR DEVICE AND FABRICATION METHOD THEREOF

TECHNICAL FIELD

The present invention relates to a silicon carbide semiconductor device that controls high breakdown voltage and large current, and uses silicon carbide, which is a wide band gap material, as a semiconductor, and a fabrication method thereof.

BACKGROUND ART

Silicon (Si) monocrystal has been used as material for power semiconductor elements that control high breakdown voltage and large current. Power semiconductor elements fall into several types and are used selectively according to the intended use. For example, since bipolar transistors and insulated gate bipolar transistors (IGBTs) cannot be switched at high speed although current density can be made larger, the use of bipolar transistors is limited up to several kHz and the use of IGBTs is limited up to about 20 kHz in frequency. On the other hand, power MOSFETs can be used at high speeds of several MHz although large current cannot be handled. Nonetheless, since a power device supporting both large current and high-speed performance is strongly demanded in the market, particular efforts are made to improve IGBTs and power MOSFETs, which have been developed substantially to the theoretical limits determined by the materials.

FIG. 12 is a cross-sectional view of a general MOSFET. An $n^-$ drift layer 102 is layered on an $n^+$ substrate 101, and a p-base layer 103 is formed on the $n^-$ drift layer 102 with an $n^+$ source layer 104 selectively formed in a surface layer of the p-base layer 103. A gate electrode 107 is formed on the $n^-$ drift layer 102 and the p-base layer 103 as well as the $n^+$ source layer 104 via a gate insulation film 106.

Moreover, super-junction MOSFETs have recently attracted attention. FIGS. 13, 14, and 15 depict a cross-sectional structure of a typical element. For example, a super-junction MOSFET is disclosed in Non-Patent Literature 1 and is disclosed as a CoolMOSFET in Non-Patent Literature 2. With these techniques, a P-layer 110 is vertically formed into a columnar structure in an $n^-$ drift layer so as to dramatically improve ON-resistance without deterioration in breakdown voltage characteristics between source and drain.

Materials are also studied in terms of power semiconductor elements and, as disclosed in Non-Patent Literature 3, silicon carbide (SiC) is recently attracting attention as a next generation power semiconductor element and as a low ON-voltage element having excellent high-speed/high-temperature characteristics. Chemically, SiC is a very stable material with a wide band gap of 3 eV and can be used extremely stably as a semiconductor even at high temperatures. SiC also has a critical electric field that is 10-fold or greater than silicon. SiC is very likely to exceed the material limit of silicon and is therefore largely expected to grow in use as power semiconductors, for example, MOSFETs, in the future. Since SiC has small ON-resistance, it is expected to realize a vertical SiC-MOSFET having lower ON-resistance with high breakdown voltage characteristics maintained.

A cross-sectional structure of a typical SiC-MOSFET is the same as that of silicon (depicted in FIG. 12). The $n^+$ source layer 104 is selectively formed in the surface layer of the p-base layer 103 laminated on the $n^-$ drift layer 102, and the gate electrode 107 is formed on the $n^-$ drift layer 102 and the p-base layer 103 as well as the $n^+$ source layer 104 via the gate insulation film 106 with the drain electrode 108 formed on the back surface of the substrate 101.

An SiC-MOSFET formed in this way is an element switchable at high speed with low ON-resistance used as a switching device. For example, the SiC-MOSFET is expected to be utilized in power converters such as an inverter for motor control and an uninterruptible power supply (UPS). Since SiC is a wide band gap semiconductor material, SiC has critical electric field about ten times higher than silicon as described above and is expected to achieve sufficiently smaller ON-resistance.

A measure for achieving lower ON-resistance is also disclosed as a method of creating an element structure even in a region under a gate pad in an attempt to expand an effective element area (see, e.g., Patent Documents 1 to 5).

Patent Document 1: Japanese Laid-Open Patent Publication No. 2010-177454
Patent Document 2: Japanese Laid-Open Patent Publication No. 2010-87126
Patent Document 3: Japanese Laid-Open Patent Publication No. 2009-105177
Patent Document 4: Japanese Laid-Open Patent Publication No. H8-102495
Patent Document 5: Japanese Laid-Open Patent Publication No. H4-239137
Non-patent Literature 1: Fujihira, et al, JJAP, Vol. 36, Part 1, No. 10, 1997, pp. 6254
Non-patent Literature 2: Deboy, et al, IEEE IEDM 1998, pp. 683
Non-patent Literature 3: IEEE Transaction on Electron Devices, Vol. 36, 1989, p. 1811

DISCLOSURE OF INVENTION

Problem to be Solved by the Invention

Nonetheless, since the critical electric field of a semiconductor is increased by a factor of ten, SiC also places a greater electric field load on an oxide film, as compared to silicon elements particularly when high voltage is applied. Therefore, a problem is newly caused in SiC by a factor that causes no problem in a silicon power device because the critical electric field of silicon is reached before a larger electric field is applied to the oxide film. In other words, SiC has a problem of destruction of the oxide film due to application of a large electric field. The larger electric field is applied to the gate oxide film 106 of the SiC-MOSFET depicted in FIG. 12 and, if the gate oxide film 106 is destroyed, a huge problem in reliability occurs. This problem occurs not only in SiC-MOSFETs but also in SiC-IGBTs.

Since the element under the gate pad described above is easily damaged when the gate pad is connected to the outside of the element, a structure for achieving lower ON-resistance is not embodied.

In view of the problem, it is an object of the present invention to provide a silicon carbide semiconductor device having low ON-resistance with reliability without destruction of a gate oxide film even when a high voltage is applied, and a fabrication method the same.

Means for Solving Problem

To achieve an object, a silicon carbide semiconductor device according to the present invention has the following characteristics. The silicon carbide semiconductor device has a semiconductor device structure created inside a semiconductor substrate, includes an electrode for establishing electric contact with the semiconductor device structure and an electrode pad for establishing electric contact with the electrode from the outside, and has the semiconductor device structure also formed in the semiconductor substrate of a lower portion of the electrode pad. The semiconductor device structure includes a first-conductivity-type semiconductor substrate and has a first-conductivity-type semiconductor layer having a lower impurity concentration formed on the semiconductor substrate with a second-conductivity-type semiconductor layer having a higher impurity concentration selectively formed in the first-conductivity-type semiconductor layer. A second-conductivity-type base layer having a lower impurity concentration is formed on a surface of the second-conductivity-type semiconductor layer, and a first-conductivity-type source region is selectively formed in a surface layer of the base layer. A first-conductivity-type well region is formed to penetrate the base layer from a surface to the first-conductivity-type semiconductor layer. A control electrode is formed via a gate insulation film on a surface of the base layer interposed between the source region and the well region. Portions of the respective second-conductivity-type semiconductor layers of different cells are connected to each other in a region under the well region.

In the silicon carbide semiconductor device, the electrode pad is a gate pad.

In the silicon carbide semiconductor device, a crystallographic plane index of the first-conductivity-type semiconductor substrate indicates a plane parallel to, or a plane tilted within 10 degrees relative to, a (000-1) plane.

In the silicon carbide semiconductor device, a crystallographic plane index of the first-conductivity-type semiconductor substrate indicates a plane parallel to, or a plane tilted within 10 degrees relative to, a (0001) plane.

In the silicon carbide semiconductor device, the source region of the gate pad portion is electrically connected by the well region to a source region of the semiconductor device structure other than the gate pad portion.

In the silicon carbide semiconductor device, the source region is interposed between second-conductivity-type semiconductor regions.

In the silicon carbide semiconductor device, the source region of the gate pad portion is formed into a linear shape.

In the silicon carbide semiconductor device, the source region of the gate pad portion is formed into a polygonal mesh shape.

A fabrication method a silicon carbide semiconductor device according to the present invention has the following characteristics. The fabricated silicon carbide semiconductor device includes a first-conductivity-type semiconductor substrate and has a first-conductivity-type semiconductor layer having a lower impurity concentration formed on the semiconductor substrate with a second-conductivity-type semiconductor layer having a higher impurity concentration selectively formed in the first-conductivity-type semiconductor layer. A second-conductivity-type base layer having a lower impurity concentration is formed on a surface of the second-conductivity-type semiconductor layer, and a first-conductivity-type source region is selectively formed in a surface layer of the base layer. A first-conductivity-type well region is formed to penetrate the base layer from a surface to the first-conductivity-type semiconductor layer, and a control electrode is formed via a gate insulation film on a surface of the base layer interposed between the source region and the well region. Portions of the respective second-conductivity-type semiconductor layers of different cells are coupled to each other in a region under the well region. In the fabrication method of such a silicon carbide semiconductor device, the first-conductivity-type semiconductor layer is formed on the semiconductor substrate by epitaxial growth. The second-conductivity-type semiconductor layer is then selectively formed in the surface of the first-conductivity-type semiconductor layer by ion implantation, and the base layer is formed on the first-conductivity-type semiconductor layer and the second-conductivity-type semiconductor layer by epitaxial growth. The method also includes selectively forming the source region in the surface layer of the base layer and the well region penetrating the base layer from a surface to the first-conductivity-type semiconductor layer by ion implantation.

According to the configuration, even if high voltage is applied between the source and the drain, a large electric field is not applied to a gate oxide film on an n-type semiconductor well region and a sufficient element breakdown voltage can be retained. Similarly, even if the impurity concentrations are significantly increased in an n-type semiconductor layer and the n-type semiconductor well region to sufficiently reduce the ON-resistance, a sufficient element breakdown voltage can be retained.

Effect of the Invention

The present invention produces an effect that lower ON-resistance can be achieved with reliability and without destruction of the gate oxide film even when a high voltage is applied.

BRIEF DESCRIPTION OF DRAWINGS

FIG. 3 is a chart of measurement results of electric characteristics of SiC-MOSFETs formed according to embodiments of the present invention;

FIGS. 8A and 8B are diagrams of another device structure under the gate pad of the SiC-MOSFET of the first embodiment;

BEST MODE(S) FOR CARRYING OUT THE INVENTION

Embodiments of a silicon carbide semiconductor device and a fabrication method thereof according to the present invention will be described in detail with reference to the accompanying drawings.

First Embodiment

Figure 1:
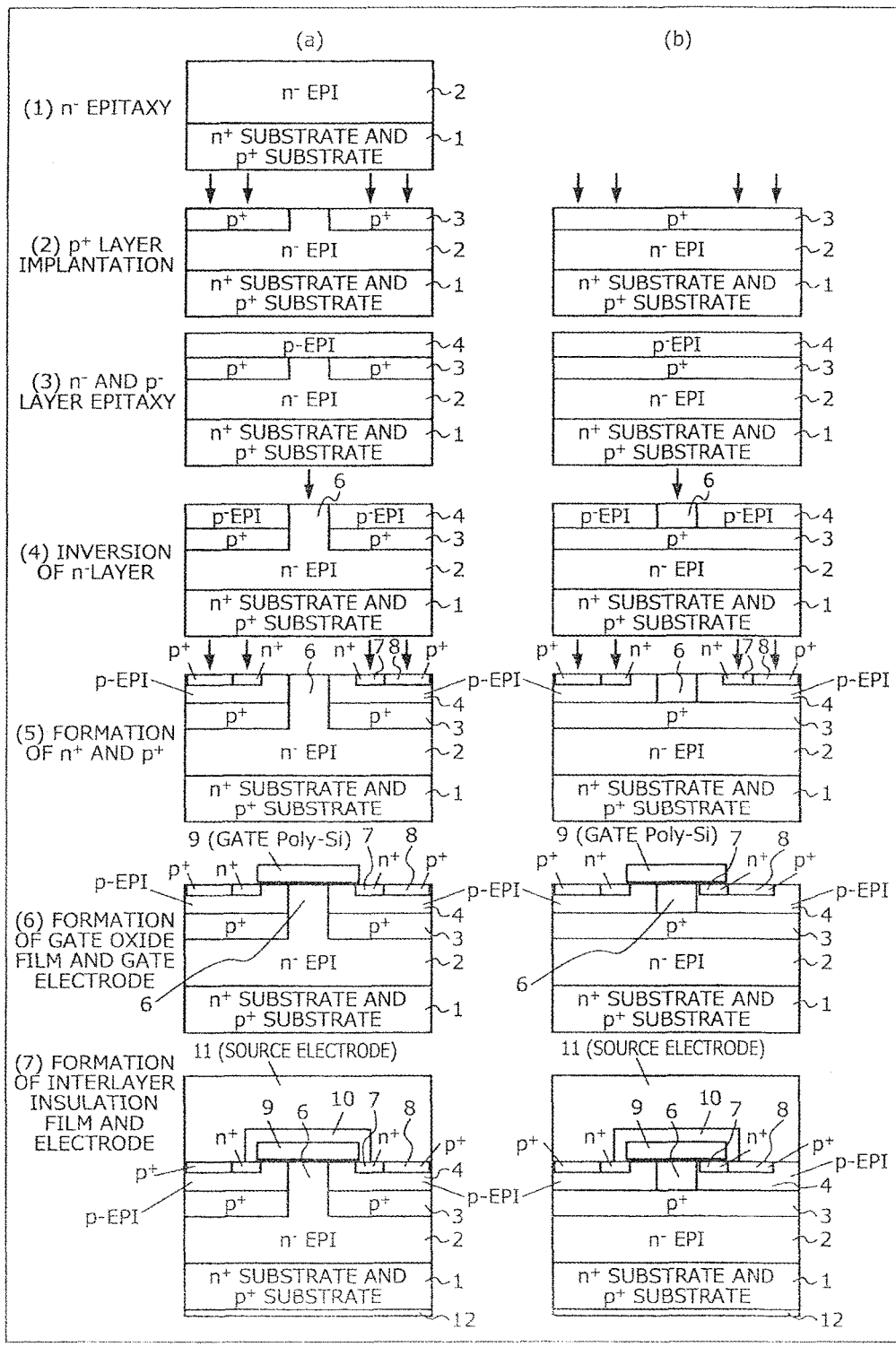
FIG. 1 is a cross-sectional view at fabrication steps of an SiC-MOSFET of a first embodiment of the present invention.

FIG. 1 is a cross-sectional view at fabrication steps of an SiC-MOSFET of a first embodiment of the present invention. In FIG. 1, (a) is a cross-sectional view of a portion in which P$^+$ layers are not connected, while (b) is a cross-sectional view of a portion in which the P$^+$ layers are connected.

In this embodiment, a vertical planar gate MOSFET is described as a MOSFET with an element breakdown voltage of 1200 V formed by using silicon carbide (SiC) as a semiconductor material. First, as depicted in (1), an n$^+$ type (first-conductivity-type) SiC semiconductor substrate 1 is prepared. In the case of an IGBT, a p$^+$ type semiconductor substrate 1 is used. In this example, the low-resistance SiC semiconductor 1 is used that includes about $2 \times 10^{19}$ cm$^{-3}$ of nitrogen as impurities. An n$^-$ type (first-conductivity-type) SiC layer 2 including about $1.8 \times 10^{16}$ cm$^{-3}$ of nitrogen is laminated by epitaxial growth to about 10 μm on a plane of the n$^+$ type semiconductor substrate 1 having a crystallographic plane index tilted by 4 degrees relative to a (000-1) plane.

As depicted in (2), a second-conductivity-type P$^+$ layer 3 is formed with a width of 13 μm and a depth of 0.5 μm by the ion implantation method on the SiC layer 2. For example, aluminum ions are used in this case. A dosage is set so as to achieve an impurity concentration of $1.0 \times 10^{18}$ cm$^{-3}$. Portions of the P$^+$ layers 3 are connected between different cells 20 under a first-conductivity-type n-inversion layer 6 described later (see (4) of FIG. 1(b) and see FIG. 2 for a plane view). A distance between unconnected positions of the P$^+$ layers 3 is set to 2 μm.

As depicted in (3), a second-conductivity-type P-base layer 4 is subsequently formed with a thickness of 0.5 μm on the P$^+$ layer 3 and the n$^-$ type SiC layer 2 by the epitaxial growth method. The impurities in this case are aluminum and an impurity concentration is set to $2.0 \times 10^{16}$ cm$^{-3}$.

As depicted in (4), nitrogen ions are selectively implanted at $5.0 \times 10^{16}$ cm$^{-3}$ to 1.5 μm in depth and 2.0 μm in width as the n-inversion layer 6. As depicted in (5), a first-conductivity-type n$^+$ source layer 7 and a second-conductivity-type p$^+$ contact layer 8 are selectively formed in the p-base layer 4.

Activation annealing is then performed. Heat treatment temperature and time are 1620 degrees C. and two minutes, respectively. As a result, as depicted in (6), a gate oxidation film is formed with a thickness of 100 nm by thermal oxidation and is annealed near 1000 degrees C. in a hydrogen atmosphere. A polycrystalline silicon layer doped with phosphorus is formed as a gate electrode 9 and patterned on the gate oxidation film.

Subsequently, as depicted in (7), a 1.0-μm-thick film of phosphorus glass is formed as an interlayer insulation film 10, which is patterned and then heat-treated. A 5-μm-thick film of aluminum including 1% silicon is formed on the surface by the sputtering method to form a surface electrode (source electrode) 11. A film of nickel is formed on the back surface of the element and, after heat treatment at 970 degrees C., a back surface electrode 12 made of titanium, nickel, and gold is formed. A protection film is then added to the surface to complete the element.

Figure 2:
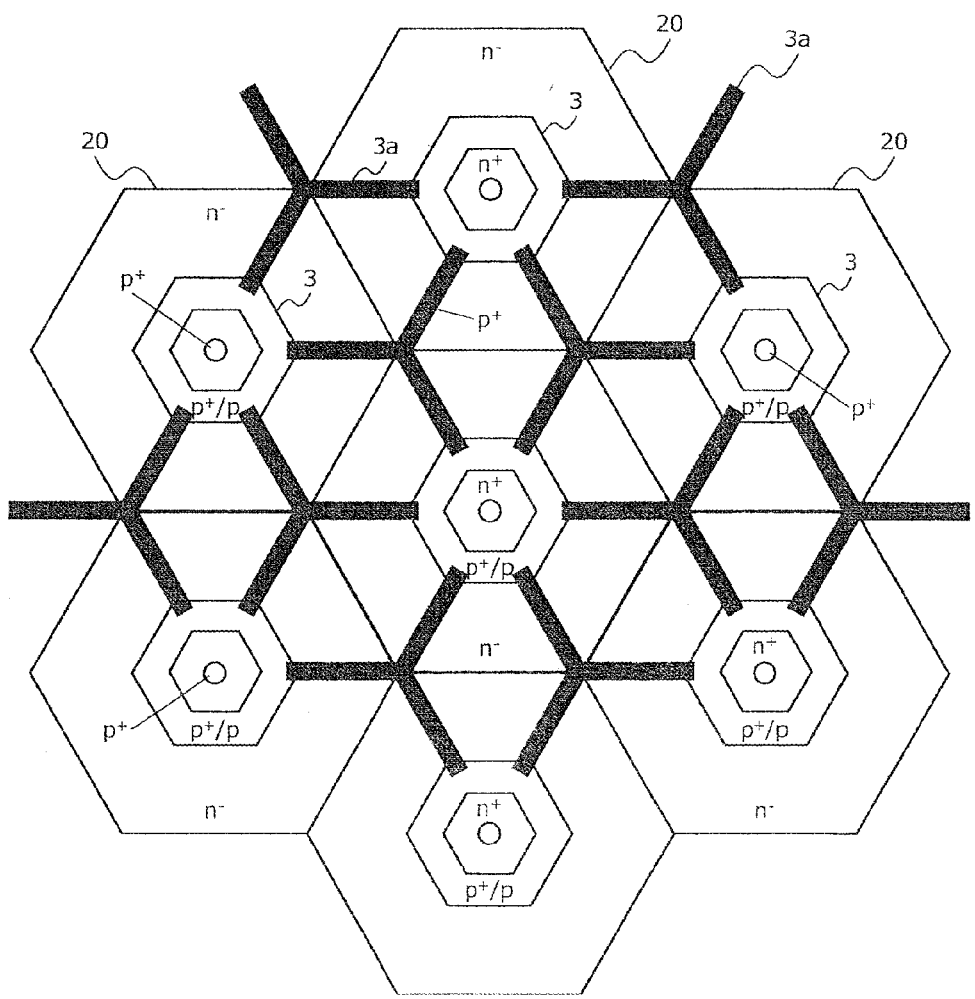
FIG. 2 is a plane view of arrangement of the P$^+$ layers and cells of the SiC-MOSFET of the first embodiment of the present invention.

FIG. 2 is a plane view of arrangement of the P$^+$ layers and cells of the SiC-MOSFET of the first embodiment of the present invention. In the example of FIG. 2, the P$^+$ layers 3 are connected by a connecting portion 3a from each corner portion toward a corner portion of another one of the cells 20 under the n-inversion layer 6. In the example of FIG. 2, the cells 20 are formed in a hexagonal cell pattern. This is not a limitation and the cells 20 may be square cells.

FIG. 3 is a chart of measurement results of electric characteristics of SiC-MOSFETs formed according to embodiments of the present invention. The die size of the embodiments of the present invention is 3 mm square with an active area of 5.27 mm$^2$ and rated current of 25 A. The ON-resistance (RonA) is a sufficiently low value of 2.8 mΩcm$^2$ and the initial element breakdown voltage is 1450 V, which is sufficiently good characteristic for a 1200-V element.

Measurement of a comparison example (conventional technique) was performed by using an SiC-MOSFET created without connection between the P$^+$ layers 3. Although ON-resistance was a comparable sufficiently low value of 2.8 mΩcm$^2$ in the case of the comparison example, the gate oxide film was destroyed when 880 V was applied between the source and the drain. This reveals that the present invention exhibits extremely low ON-resistance while maintaining sufficient element breakdown voltage.

Figure 4:
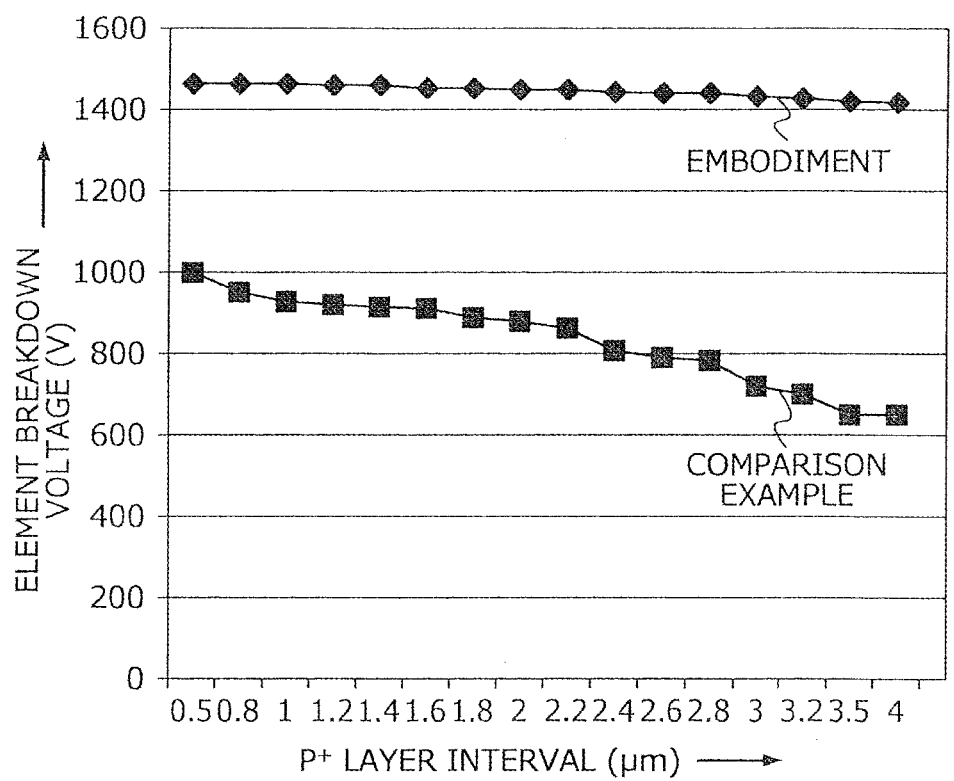
FIG. 4 is a chart of actual measurement results of element breakdown voltage when the element breakdown voltage and the n-inversion layer width are changed in the first embodiment and a comparison example.

FIG. 4 is a chart of actual measurement results of element breakdown voltage when the element breakdown voltage and the n-inversion layer width are changed in the first embodiment and a comparison example. The comparison example is the SiC-MOSFET without connection of the P$^+$ layer 3 between cells as described above. Concentration and thickness of each layer of the elements are as described above. As a result, it can be seen that the first embodiment of the present invention realizes a high breakdown voltage characteristic of 1400 V or higher, which is a sufficient breakdown voltage characteristic for a 1200-V device. The ON-resistance is the same in both the first embodiment and the comparison example and it is found that creating a cell under a gate pad as in the first embodiment is effective for reducing the ON-resistance.

It is found that, to satisfy the high breakdown voltage characteristic of 1400 V or higher equivalent to the first embodiment in the SiC-MOSFET of the comparison example, a distance between the P$^+$ layers 3 must be equal to or less than 1.0 μm while the inversion concentration of the n-inversion layer 6 must be reduced to one fifth. The ON-resistance in the comparison example of this condition indicates an extremely high value of 10.8 mΩcm$^2$. Therefore, the present invention has the ON-resistance smaller than the comparison example and can improve the element breakdown voltage characteristic at the same time.

Figure 5:
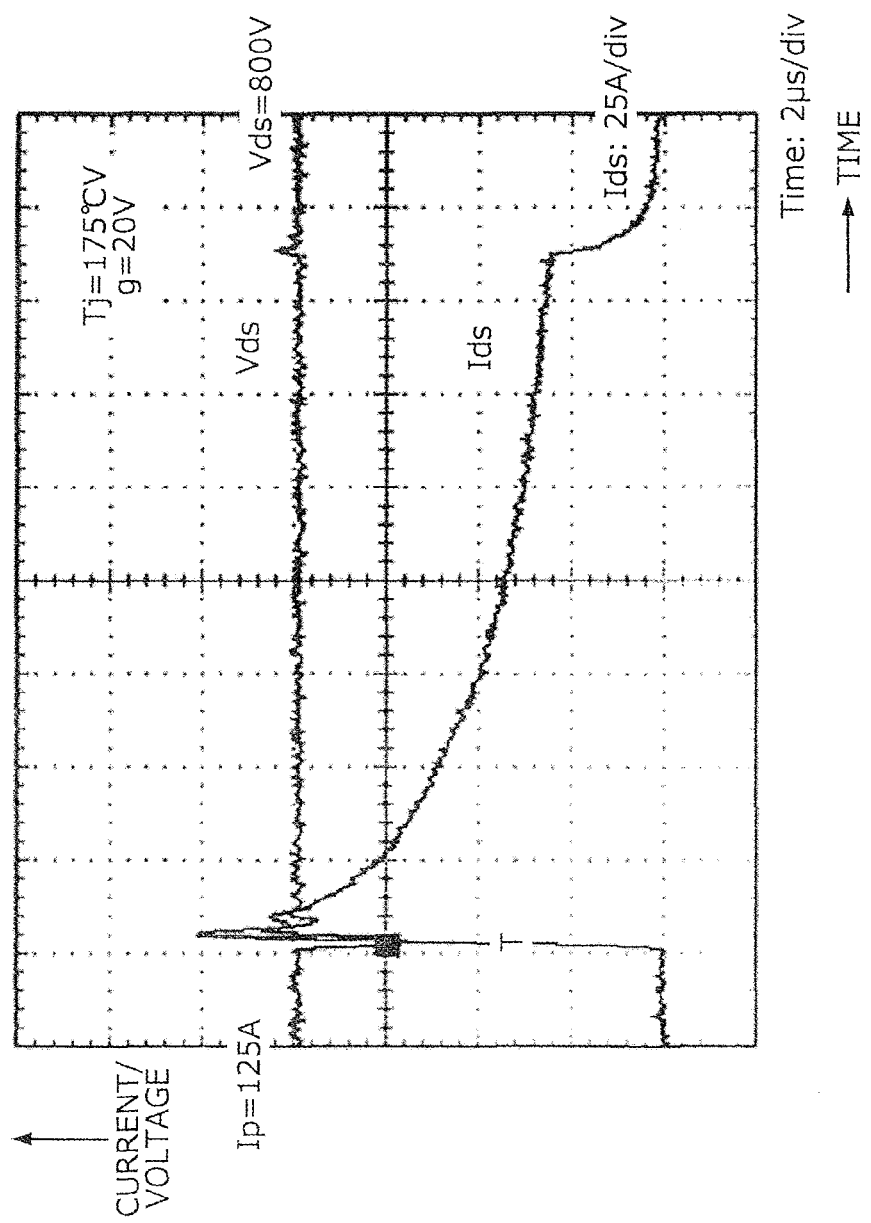
FIG. 5 is a chart of measurement results of load short circuit capability of the SiC-MOSFET of the first embodiment.

FIG. 5 is a chart of measurement results of load short circuit capability of the SiC-MOSFET of the first embodiment. In a load short circuit capability test, source voltage is directly applied between the source and the drain and a voltage Vg=20 V is applied to the gate electrode in this state to evaluate a period without destruction of the gate oxidation film in sec. Conditions during the measurement were a source voltage Vcc=800 V and a measurement temperature (Tj) of 175 degrees C. As indicated by measurement waveforms of FIG. 5, the element was not destroyed even when the element conducted the maximum current of 125 A, which is five times larger than the element rating, and was not destroyed even after 15 sec, exhibiting sufficient characteristics.

Figure 6:
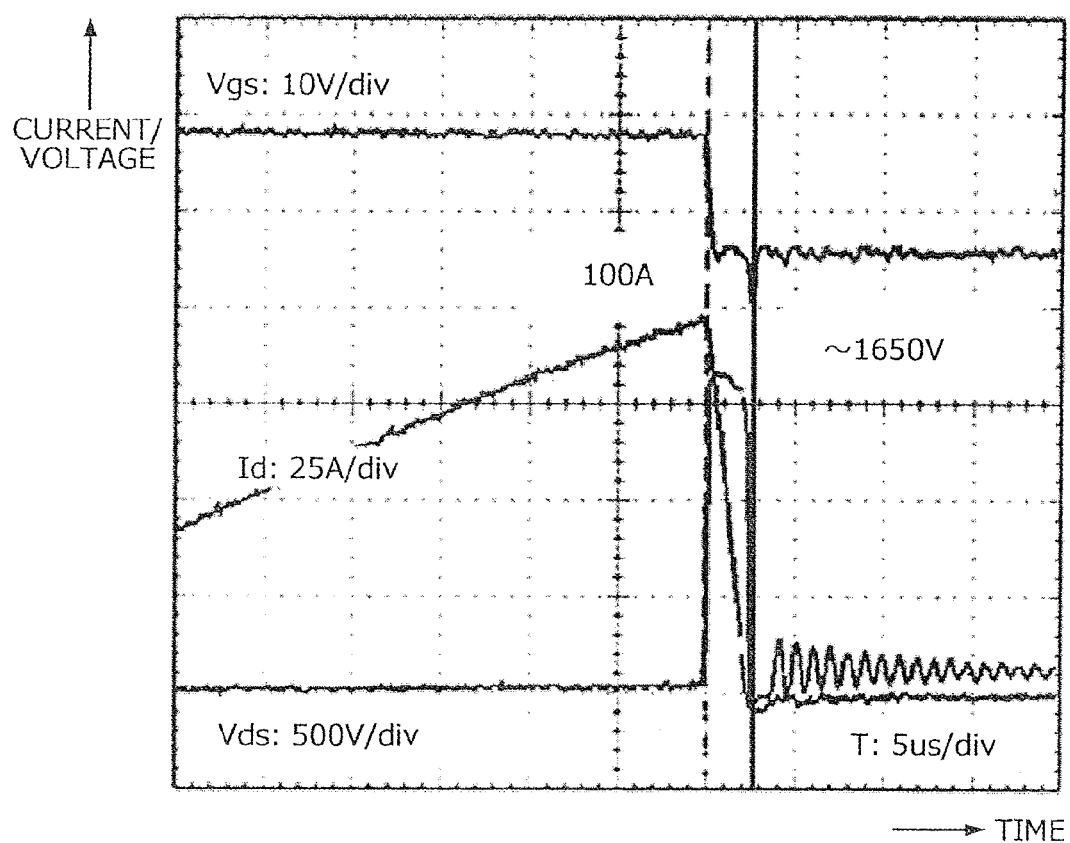
FIG. 6 is a chart of evaluation results of turn-off failure capability of the SiC-MOSFET of the first embodiment.

FIG. 6 is a chart of evaluation results of turn-off failure capability of the SiC-MOSFET of the first embodiment. When the turn-off capability was evaluated, a source-drain voltage was clamped at 1630 V (Vds clamp of FIG. 6) and it was confirmed that the SiC-MOSFET was able to be turned off at 100 A (four times larger than rated current) at 150 degrees C. without destruction. Therefore, it is understood that the element of the first embodiment is an element realizing low ON-resistance and having extremely large load short circuit capability and turn-off capability. When the capabilities of the SiC-MOSFET of the comparison example were evaluated, the results of both the load short circuit capability and the turn-off capability were quite inferior to the element of the first embodiment because of insufficient element breakdown voltage (see, FIG. 3).

Even when elements were created by forming the SiC layer 2 in the same way on the planes of the n-type semiconductor substrate 1 having the crystallographic plane index tilted by 0, 2, 8, and 10 degrees relative to the (000-1) plane, the characteristics were almost unchanged and were favorable.

Figure 7A:
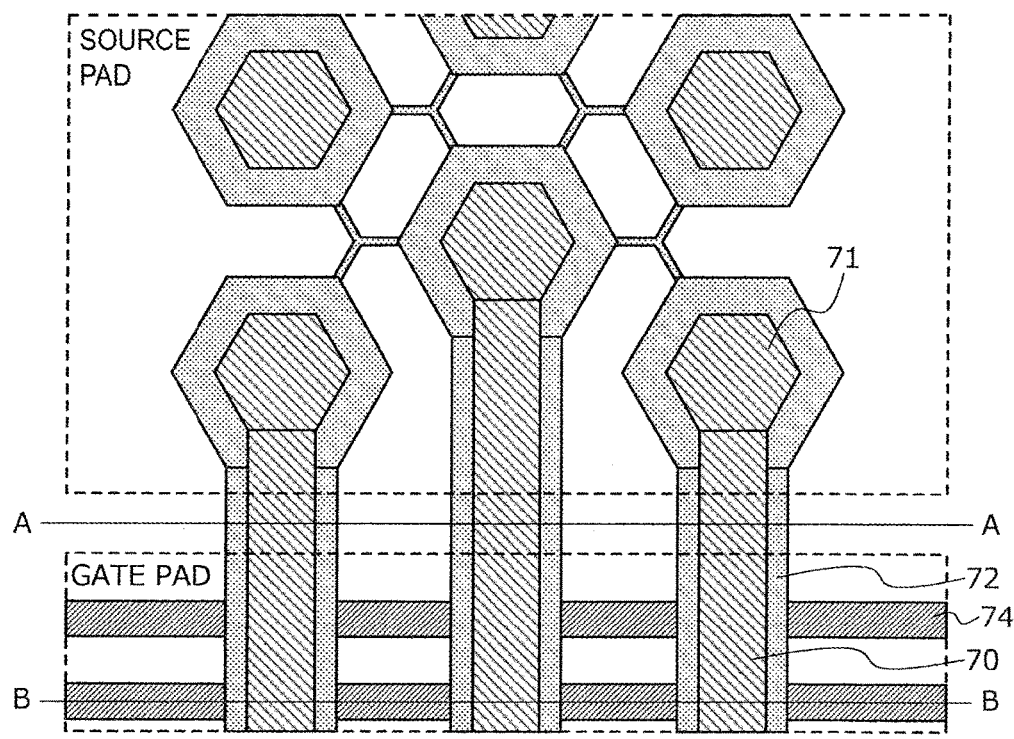
FIGS. 7A, 7B, and 7C are diagrams of a device structure under the gate pad of the SiC-MOSFET of the first embodiment.
Figure 7B:
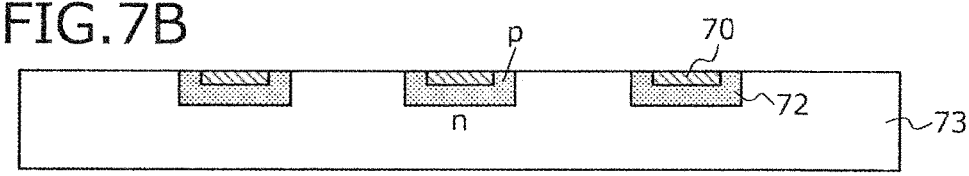
Figure 7C:
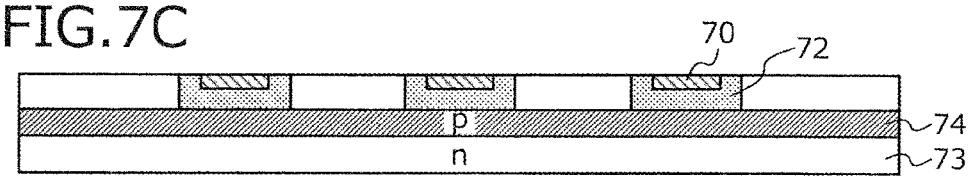

FIGS. 7A, 7B, and 7C are diagrams of a device structure under the gate pad of the SiC-MOSFET of the first embodiment. FIG. 7A is a plane view; FIG. 7B is a cross-sectional view taken along a cut line A-A of FIG. 7A; FIG. 7C is a cross-sectional view taken along a cut line B-B of FIG. 7A; and the gate electrode and the oxide film are not depicted. To further reduce the ON-resistance in the configuration of the first embodiment, as depicted in FIGS. 7A, 7B, and 7C, a source region 70 is formed under the gate pad such that the source region 70 is electrically connected from a source region 71 under a source pad by using an n-type semiconductor. This n-type semiconductor source region 70 must be separated by a p-type semiconductor region 72 from an n-type semiconductor region 73 acting as a well. In FIGS. 7A, 7B, and 7C, the source region 70 under the gate pad has a linear shape and a p-layer (second-conductivity-type region) 74 for protecting a gate oxide film is disposed orthogonally to the source region 70.

FIGS. 8A and 8B are diagrams of another device structure under the gate pad of the SiC-MOSFET of the first embodiment. FIG. 8A is a plane view; FIG. 8B is a cross-sectional view taken along a cut line C-C of FIG. 8A; and the gate electrode and the oxide film are not depicted. The source region 71 under the gate pad is formed into a hexagonal mesh shape. The p-layer 74 for protecting the gate oxide film is floated at the center of the hexagonal source region 70. The shape of the source region 71 is not limited to a hexagonal shape and may be a polygonal shape.

As depicted in FIGS. 7A, 7B, 7C, 8A and 8B, by fabricating an element under the gate pad, an element utilization area can be increased within the area of the same device and the ON-resistance can be reduced. As seen therein, a first area ratio of the portion of the source region under the gate pad compared with a whole portion under the gate pad is larger than a second area ratio of a portion of the source region under a source pad compared with a whole portion under the source pad.

Second Embodiment

In a second embodiment of the present invention, a 1200-V 25-A SiC-MOSFET was formed by the same fabrication steps as the first embodiment. In the second embodiment, the n-type SiC layer 2 including about $1.8 \times 10^{16}$ cm$^{-3}$ of nitrogen was epitaxially grown to about 10 μm on the plane of the n-type semiconductor substrate 1 having the crystallographic plane index tilted by 4 degrees relative to the (0001) plane. The other steps and the cell structure were completely the same as the first embodiment. As described in the electric characteristic evaluation results of the element of the second embodiment depicted in FIG. 3, although the ON-resistance is increased by about 55% as compared to the first embodiment, it can be seen that the element has the sufficiently low ON-resistance characteristic as compared to normal SiC-MOSFETs. When the n-type SiC layer 2 was formed in the same way on the planes of the n-type semiconductor substrate 1 having the crystallographic plane index tilted by 0, 2, 8, and 10 degrees relative to the (0001) plane and the element evaluation was performed for the created elements, the characteristics were almost unchanged and were favorable.

Third Embodiment

In a third embodiment of the present invention, a 1200-V 25-A SiC-MOSFET was formed by the same fabrication steps as the first embodiment. The n-type SiC layer 2 including about $1.8 \times 10^{16}$ cm$^{-3}$ of nitrogen was epitaxially grown to about 10 μm on the plane of the n-type semiconductor substrate 1 having the crystallographic plane index tilted by 4 degrees relative to the (000-1) plane.

Figure 9:
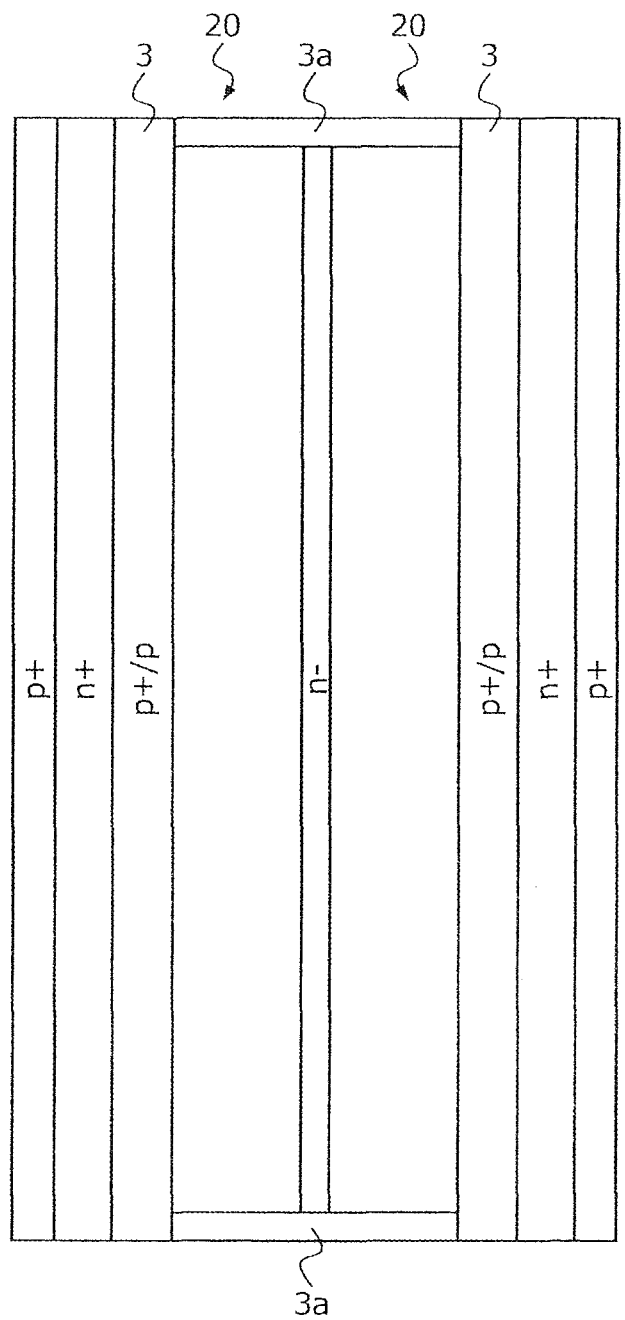
FIG. 9 is a diagram of arrangement of the P$^+$ layers and cells of the SiC-MOSFET of the third embodiment of the present invention.

FIG. 9 is a diagram of arrangement of the P$^+$ layers and cells of the SiC-MOSFET of the third embodiment of the present invention. As depicted in FIG. 9, the cells are formed in a stripe pattern. Therefore, the arrangement of the P$^+$ layers 3 allows the P$^+$ layers 3 to be connected by the connecting portion 3a between the cells 20, 20. The other steps are the same as the first embodiment. As described in the electric characteristic evaluation results of the formed element depicted in FIG. 3, although the ON-resistance is increased by about 10% as compared to the first embodiment, it can be seen that the element has the sufficiently low ON-resistance characteristic and the high breakdown voltage characteristic as compared to normal SiC-MOSFETs.

Fourth Embodiment

A fabrication method a fourth embodiment of the present invention will be described. First, the n-type SiC semiconductor substrate 1 is prepared. The low-resistance SiC semiconductor 1 is used that includes about $2 \times 10^{19}$ cm$^{-3}$ of nitrogen as impurities. The n-type SiC layer 2 including about $1.8 \times 10^{16}$ cm$^{-3}$ of nitrogen is epitaxially grown to about 10 μm on a plane of the n-type semiconductor substrate 1 having the crystallographic plane index tilted by 4 degrees relative to a (000-1) plane. The P$^+$ layer 3 is formed with a width of 13 μm and a depth of 0.5 μm by the epitaxial method on the n-type SiC layer 2. Aluminum was used for impurity ions in this case. A dosage is set so as to achieve an impurity concentration of $1.0 \times 10^{18}$ cm$^{-3}$. As is the case with the first embodiment, portions of the P$^+$ layers 3 are connected to each other under the n-inversion layer 6 (see FIG. 2). Although the cells were formed in a hexagonal cell pattern in the fourth embodiment, the cells may be square cells etc. A distance between the P$^+$ layers 3 at unconnected positions of the P$^+$ layers 3 is set to 2 µm.

The P-base layer 4 is subsequently formed with a thickness of 0.5 µm on the P$^+$ layer 3 and the n-type SiC layer 2 by the epitaxial growth method. The impurities in this case are aluminum and an impurity concentration is set to 2.0×10$^{16}$ cm$^{-3}$. Nitrogen ions are selectively implanted as the n-inversion layer 6, and the n$^+$ source layer 7 and the p$^+$ contact layer 8 are selectively formed in the p-base layer 4. The n-inversion layer 6 has the concentration, thickness, and width same as the first embodiment.

Activation annealing is then performed. Heat treatment temperature and time are 1620 degrees C. and two minutes, respectively. The gate oxidation film is formed with a thickness of 100 nm by thermal oxidation and is annealed near 1000 degrees C. in a hydrogen atmosphere. After a polycrystalline silicon layer doped with phosphorus is formed and patterned as a gate electrode, a 1.0-µm-thick film of phosphorus glass is formed as the interlayer insulation film 10 and is patterned and heat-treated, and a 5-µm-thick film of aluminum including 1% silicon is formed on the surface by the sputtering method. A film of nickel is formed on the back surface of the element and, after heat treatment at 970 degrees C., the back surface electrode 12 made of titanium, nickel, and gold is formed. A protection film is then added to the surface to complete the element.

FIG. 3 depicts measurement results of electric characteristics of the SiC-MOSFET of the fourth embodiment formed as described above. A die size is 3 mm square with an active area of 5.27 mm$^2$ and rated current of 25 A. The ON-resistance (RonA) is a sufficiently low value of 2.85 mΩcm$^2$ and the initial element breakdown voltage is 1455 V, which is sufficiently good characteristic for a 1200-V element. When films were formed in the same way on the planes of the n-type semiconductor substrate 1 having the crystallographic plane index tilted by 0, 2, 8, and 10 degrees relative to the (000-1) plane and the element evaluation was performed for the created elements, the characteristics were almost unchanged and were favorable.

Fifth Embodiment

In a fifth embodiment, a 1200-V 25-A SiC-MOSFET was produced by the same fabrication steps as the fourth embodiment. However, in the fifth embodiment, the n-type SiC layer 2 including about 1.8×10$^{16}$ cm$^{-3}$ of nitrogen was epitaxially grown to about 10 µm on the plane of the n-type semiconductor substrate 1 having the crystallographic plane index tilted by 4 degrees relative to the (0001) plane. The other steps were completely the same as the fourth embodiment. The electric characteristic evaluation results of the produced element are depicted in FIG. 4. Although the ON-resistance is increased by about 50% as compared to the fourth embodiment, it can be seen that the element has the sufficiently low ON-resistance characteristic as compared to normal SiC-MOSFETs. When films were formed on the planes of the n-type semiconductor substrate 1 having the crystallographic plane index tilted by 0, 2, 8, and 10 degrees relative to the (0001) plane and the element evaluation was performed for the formed elements, the characteristics were almost unchanged and were favorable.

Figure 10A:
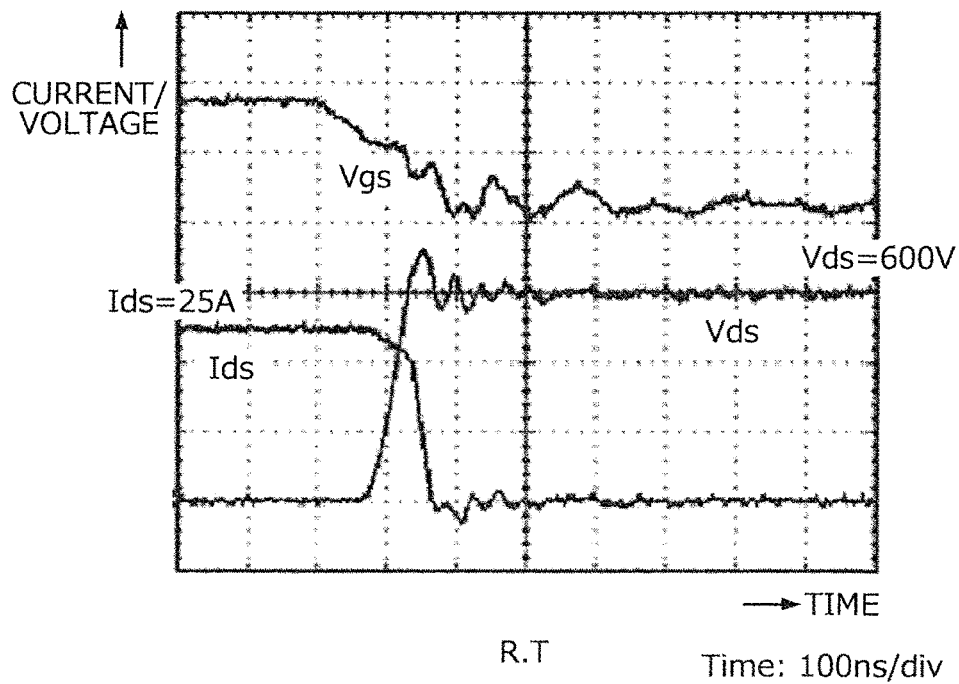
FIGS. 10A and 10B are charts of turn-on switching waveforms of the SiC-MOSFETs of the embodiments.
Figure 10B:
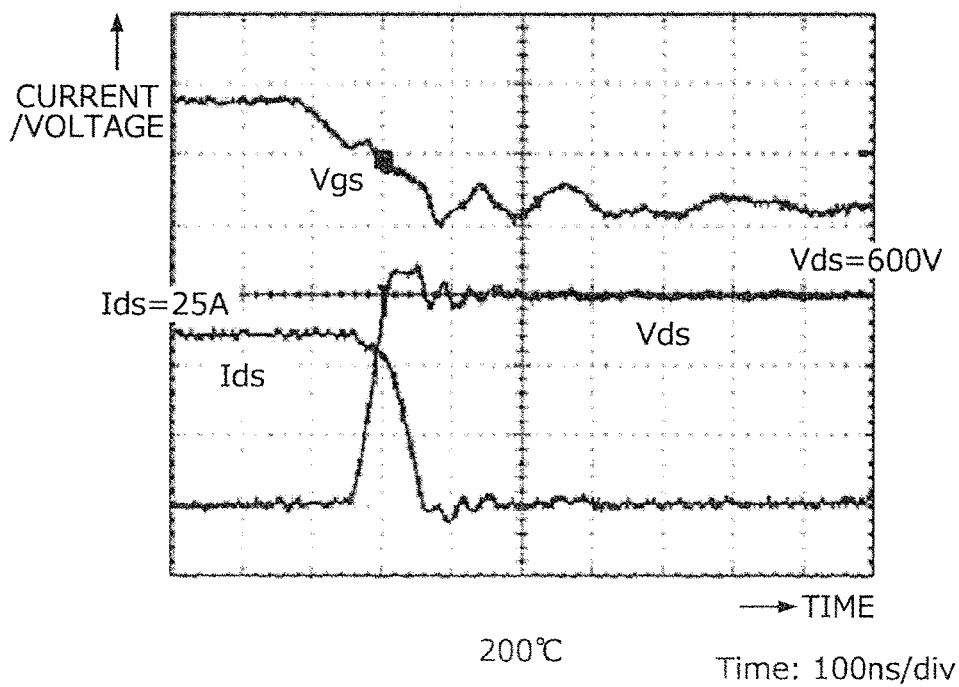
Figure 11A:
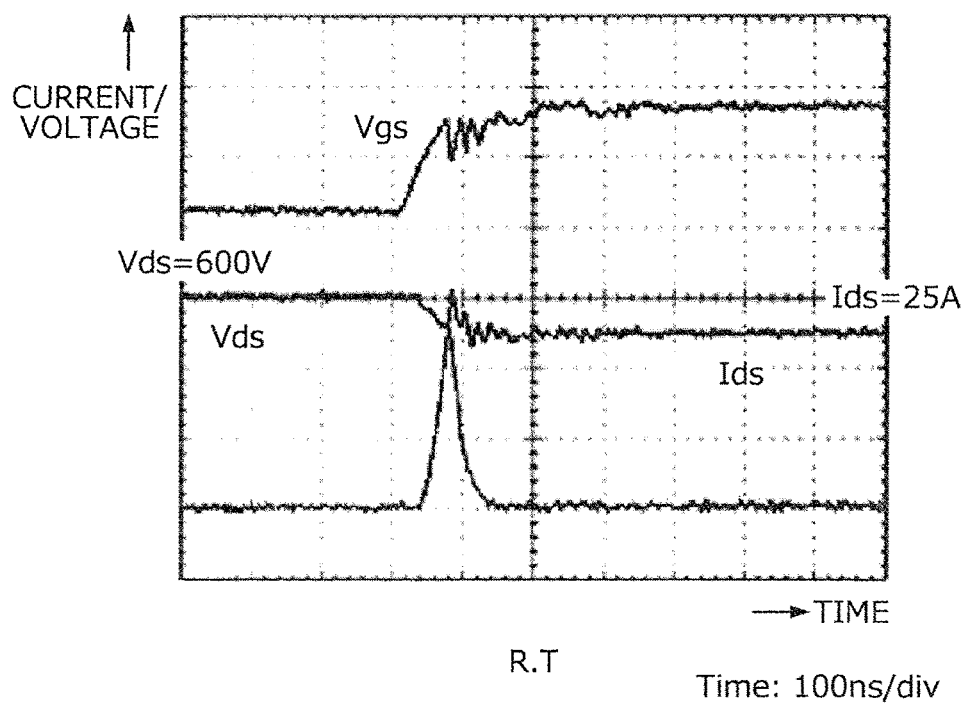
FIGS. 11A and 11B are charts of turn-off switching waveforms of the SiC-MOSFETs of the embodiments.
Figure 11B:
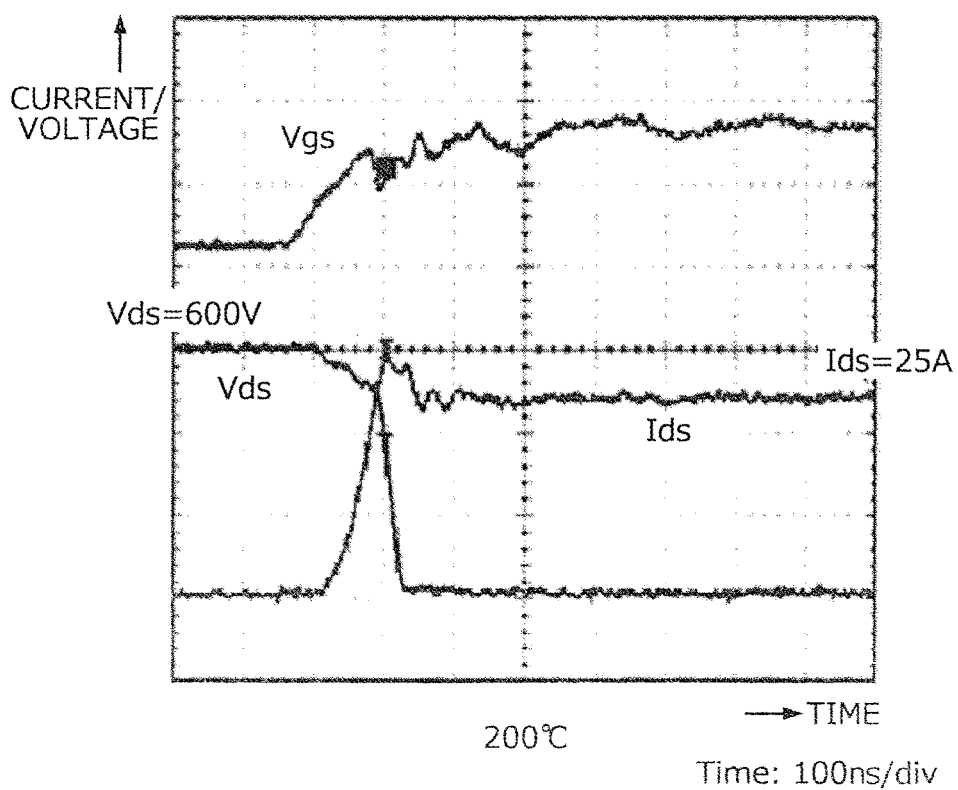
Figure 12:
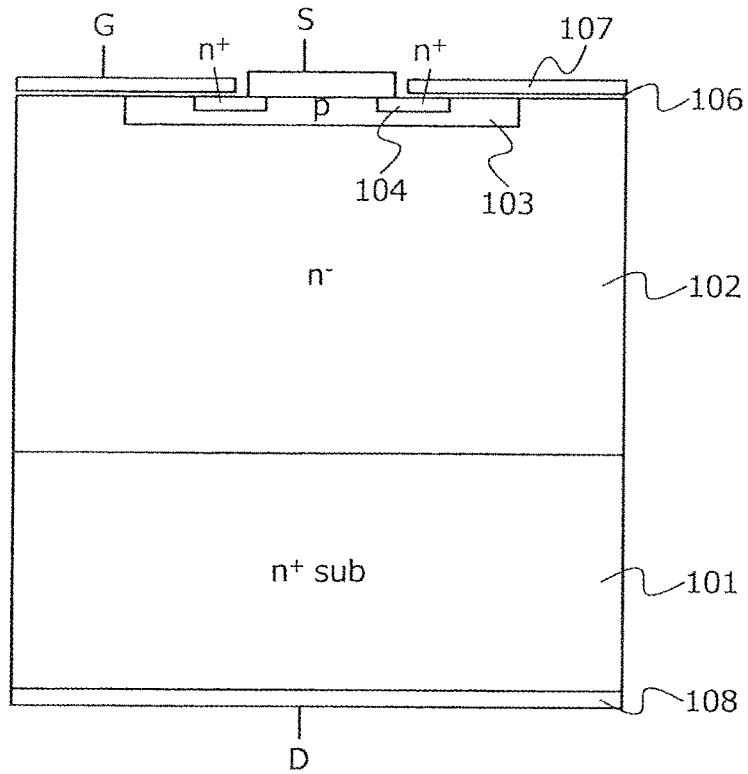
FIG. 12 is a cross-sectional view of a general MOSFET.
Figure 13:
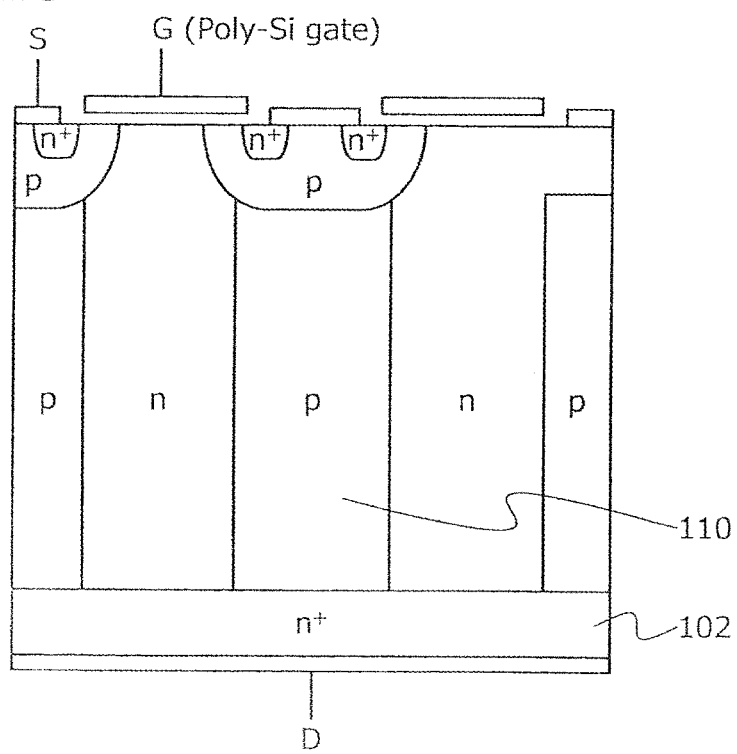
FIG. 13 depicts a cross-sectional structure of a typical element.
Figure 14:
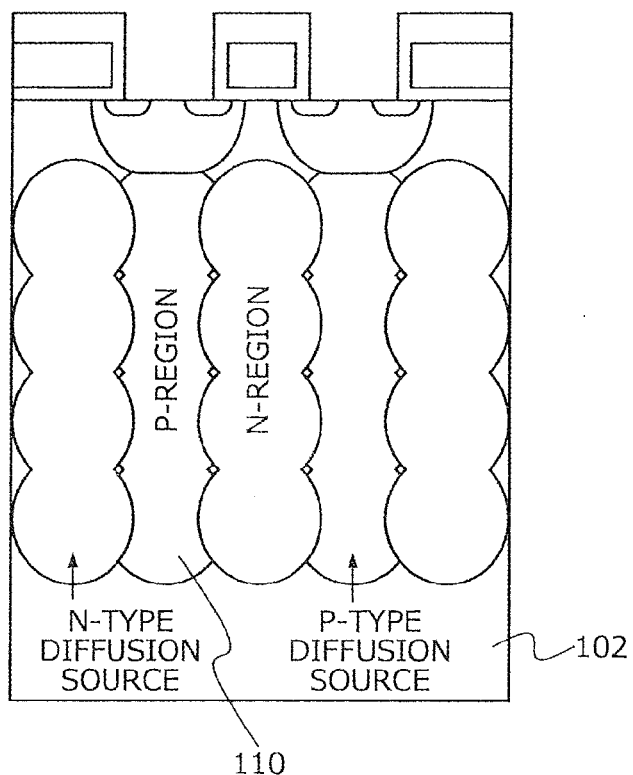
FIG. 14 depicts a cross-sectional structure of a typical element (multi-epi method)
Figure 15:
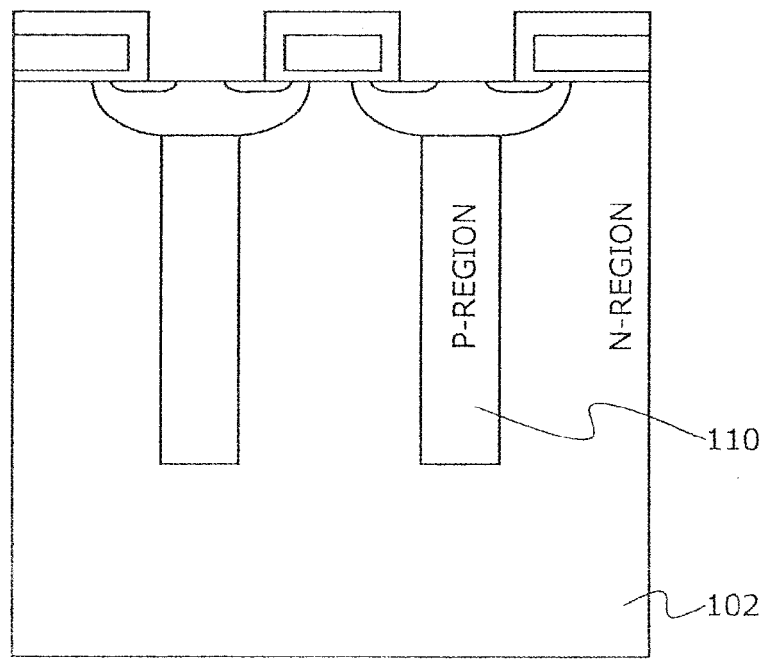
FIG. 15 depicts a cross-sectional structure of a typical element (trench embedding method).

FIGS. 10A and 10B are charts of turn-on switching waveforms of the SiC-MOSFETs of the embodiments and FIGS. 11A and 11B are charts of turn-off switching waveforms of the SiC-MOSFETs of the embodiments. The charts represent the switching loss evaluations of the SiC-MOSFETs formed in the first to fifth embodiments. The measurement results of FIGS. 10A and 11A were acquired at room temperature and the measurement results of FIGS. 10B and 11B were acquired at a temperature of 200 degrees, respectively. The turn-on loss and the turn-off loss were able to be reduced and the favorable waveforms were acquired from both the turn-on switching and the turn-off. According to the SiC-MOSFET of the present invention, as depicted in FIG. 3, both the turn-on and turn-off losses can be reduced by 60% or more as compared to an Si-IGBT of the same rating (1200 V and 25 A).

According to the configuration, if the impurity concentrations are significantly increased in the n-type semiconductor layer and the n-type semiconductor well region to sufficiently reduce the ON-resistance, or if the distances are made larger between the p-type semiconductor layers and between the base layers to sufficiently reduce the ON-resistance, or if a higher voltage is applied between the source and the drain (the source is 0 V and a positive voltage is applied to the drain), a large electric field is not applied to the gate oxide film on the n-type semiconductor well region and a sufficient element breakdown voltage can be retained in any case. This is because a depletion layer can easily spread in the lateral direction along the P$^+$ contact layer. As a result, because of the design facilitating the spread of the depletion layer even when the impurity concentrations of the n-type semiconductor layer and the n-type semiconductor well region are set to be higher than conventional Si-MOSFETs, the distances can be made larger between the p-type contact layers and between the p-type base layers to make the ON-resistance smaller while the element breakdown voltage is sufficiently maintained.

If the p-type base layer is formed by the epitaxial growth method, the base layer can be made flat almost without surface roughness and therefore, the mobility of a MOSFET portion on the surface becomes extremely large and, as a result, the ON-resistance can be made further smaller.

If silicon carbide is used as the semiconductor material, a crystallographic plane index of the n-type semiconductor substrate can be set to a plane parallel to, or within 10 degrees relative to, the (000-1) plane, or a crystallographic plane index of the n-type semiconductor substrate can be set to a plane parallel to, or within 10 degrees relative to, the (0001) plane to reduce the interface state density at the interface between the gate oxide film and the semiconductor and to further improve the mobility of the MOSFET portion. As a result, the ON-resistance can be made extremely small.

By achieving a structure in which the source region is formed to create an element structure also under the gate pad, the effective element area can be increased to make the ON-resistance smaller without the need for a complicated layered electrode structure.

Although the silicon carbide semiconductor device of the present invention has been described by taking a MOSFET as an example in the embodiments, this is not a limitation. For example, the present invention is also applicable to an IGBT and the IGBT can have low ON-resistance with reliability without destruction of a gate oxide film even when a high voltage is applied.

The present invention enables the provision of power devices such as MOSFETs and IGBTs having low ON-resistance and large critical electric field and capable of achieving high-speed switching characteristics while retaining sufficient element breakdown voltage characteristics regardless of crystal plane orientation of the substrate.

INDUSTRIAL APPLICABILITY

As described above, the present invention is generally applicable to power devices using SiC substrates and is useful for manufacturing of MOSFETs and IGBTs.

EXPLANATIONS OF LETTERS OR NUMERALS

1 SiC semiconductor substrate
2 SiC layer
3 P⁺ layer
4 base layer
6 n-inversion layer
7 source layer
8 contact layer
11 source electrode
12 back surface electrode
20 cell

The invention claimed is:

1. A silicon carbide semiconductor device having a semiconductor device structure created inside a semiconductor substrate, the silicon carbide semiconductor device comprising:
   a gate pad configured to establish electric contact with an outside electrode, wherein
   the semiconductor device structure is formed in the semiconductor substrate at a lower portion beneath the gate pad,
   the semiconductor device structure includes:
      a first-conductivity-type semiconductor substrate,
      a first-conductivity-type semiconductor layer having a first impurity concentration and formed on the semiconductor substrate,
      a second-conductivity-type semiconductor layer having a second impurity concentration and selectively formed in the first-conductivity-type semiconductor layer,
      a second-conductivity-type base layer having a third impurity concentration and formed on a surface of the second-conductivity-type semiconductor layer,
   wherein the second impurity concentration is a greater concentration than the first impurity concentration and the third impurity concentration,
      a first-conductivity-type source region selectively formed in a surface layer of the base layer,
      a first-conductivity-type well region formed to penetrate from the surface layer of the base layer to the first-conductivity-type semiconductor layer, and
      a gate electrode formed over a gate insulation film on a surface of the base layer interposed between the source region and the well region,
   a plurality of the semiconductor device structure constituting a plurality of different cells,
   portions of the respective second-conductivity-type semiconductor layers of the different cells are connected to each other in a region under the respective well regions,
   wherein a portion of the source region under the gate pad is electrically connected to a portion of the source region of the semiconductor device structure other than the portion of the source region under the gate pad,
   the source region is surrounded by a second-conductivity-type semiconductor region, and
   a first area ratio of the portion of the source region under the gate pad compared with a whole portion under the gate pad is larger than a second area ratio of a portion of the source region under a source pad compared with a whole portion under the source pad.

2. The silicon carbide semiconductor device according to claim 1, wherein
   a crystallographic plane index of the first-conductivity-type semiconductor substrate indicates a plane parallel to, or a plane tilted within 10 degrees relative to, a (000-1) plane.

3. The silicon carbide semiconductor device according to claim 1, wherein
   a crystallographic plane index of the first-conductivity-type semiconductor substrate indicates a plane parallel to, or a plane tilted within 10 degrees relative to, a (0001) plane.

4. The silicon carbide semiconductor device according to claim 1, wherein
   the source region of the gate pad portion is formed into a linear shape.

5. The silicon carbide semiconductor device according to claim 1, wherein
   the source region of the gate pad portion is formed into a polygonal mesh shape.

* * * * *

UNITED STATES PATENT AND TRADEMARK OFFICE
CERTIFICATE OF CORRECTION

PATENT NO. : 9,673,313 B2  
APPLICATION NO. : 14/403422  
DATED : June 6, 2017  
INVENTOR(S) : Atsushi Tanaka et al.

Page 1 of 1

It is certified that error appears in the above-identified patent and that said Letters Patent is hereby corrected as shown below:

On the Title Page

Item (71):  
Change:  
(71) Applicants: FUJI ELECTRIC CO., LTD., Kawasaki-shi, Kanagawa (JP); "NATIONAL INSTITUTE OF ADVANCED INDUSTRIAL SCIENCE AND TECHNOLOGY, Tokyo (JP)"

To be:  
(71) Applicants: FUJI ELECTRIC CO., LTD., Kawasaki-shi, Kanagawa (JP)

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*